United States Patent [19]
Smith

[11] Patent Number: 5,600,530
[45] Date of Patent: Feb. 4, 1997

[54] ELECTROSTATIC CHUCK

[75] Inventor: Peter C. Smith, Burlingame, Calif.

[73] Assignee: The Morgan Crucible Company plc, Windsor, England

[21] Appl. No.: 258,232

[22] Filed: Jun. 10, 1994

Related U.S. Application Data

[63] Continuation-in-part of Ser. No. 925,086, Aug. 4, 1992, Pat. No. 5,368,220.

[51] Int. Cl.⁶ .................................................. H02N 13/00
[52] U.S. Cl. ........................................................ 361/234
[58] Field of Search ............................ 361/234; 279/128

[56] References Cited

U.S. PATENT DOCUMENTS

| | | |
|---|---|---|
| 2,121,590 | 6/1938 | Espe . |
| 2,897,424 | 7/1959 | Waring . |
| 3,150,678 | 9/1964 | Nuber . |
| 3,197,682 | 7/1965 | Klass et al. . |
| 3,253,200 | 5/1966 | Klass et al. . |
| 3,401,628 | 9/1968 | Fredrickson . |
| 3,436,109 | 4/1969 | Loose . |
| 3,517,437 | 6/1970 | Szobanya . |
| 3,662,455 | 5/1972 | Anderson ............................ 228/124.6 |

(List continued on next page.)

FOREIGN PATENT DOCUMENTS

| | | |
|---|---|---|
| 0049588 | 4/1982 | European Pat. Off. . |
| 005811 | 7/1982 | European Pat. Off. . |
| 0074691 | 3/1983 | European Pat. Off. . |
| 0113928 | 7/1984 | European Pat. Off. . |
| 0115074 | 8/1984 | European Pat. Off. . |
| 0138254 | 4/1985 | European Pat. Off. . |
| 0080535 | 8/1985 | European Pat. Off. . |
| 0171011 | 2/1986 | European Pat. Off. . |
| 0260150 | 3/1988 | European Pat. Off. . |
| 0278741 | 8/1988 | European Pat. Off. . |
| 0297227 | 1/1989 | European Pat. Off. . |

(List continued on next page.)

OTHER PUBLICATIONS

J. T. Klomp, *Bonding of Metals to Ceramics and Glasses* (1972).

Abstract of Japanese Patent Application No. 58–190037 (Nov. 5, 1983).

*Primary Examiner*—Fritz Fleming
*Attorney, Agent, or Firm*—Dean W. Russell; Kilpatrick & Cody

[57] ABSTRACT

Electrostatic chucks and methods of forming the chucks are disclosed. The chucks include ceramic materials directly bonded with a layer of active braze alloy. The active alloy operates as both a conductive layer of the electrostatic chuck and a mechanism for bonding the dielectric layer to the base of the chuck. Electrical feedthroughs to the electrode may also be formed using the active alloy.

9 Claims, 2 Drawing Sheets

U.S. PATENT DOCUMENTS

| | | |
|---|---|---|
| 3,746,896 | 7/1973 | Gruner . |
| 3,858,097 | 12/1974 | Polye . |
| 3,901,772 | 8/1975 | Guillotin et al. . |
| 3,916,270 | 10/1975 | Wachtler et al. . |
| 3,929,426 | 12/1975 | Blust et al. . |
| 3,983,401 | 9/1976 | Livesay . |
| 3,993,509 | 11/1976 | McGinty . |
| 4,163,168 | 7/1979 | Ishikawa et al. . |
| 4,184,188 | 7/1980 | Briglia . |
| 4,345,299 | 8/1982 | Ho . |
| 4,371,588 | 2/1983 | Kyle . |
| 4,384,918 | 5/1983 | Abe . |
| 4,412,133 | 10/1983 | Eckes et al. . |
| 4,480,284 | 10/1984 | Tojo et al. . |
| 4,502,094 | 2/1985 | Lewin et al. . |
| 4,507,975 | 4/1985 | Bittner et al. . |
| 4,520,421 | 5/1985 | Sakitani et al. . |
| 4,551,192 | 11/1985 | Di Milia et al. . |
| 4,554,611 | 11/1985 | Lewin . |
| 4,591,535 | 5/1986 | Mizuhara .................................. 428/627 |
| 4,623,513 | 11/1986 | Mizuhara . |
| 4,645,218 | 2/1987 | Ooshio et al. . |
| 4,665,463 | 5/1987 | Ward et al. . |
| 4,667,110 | 5/1987 | Kariya . |
| 4,692,836 | 9/1987 | Suzuki . |
| 4,716,649 | 1/1988 | Bittner et al. . |
| 4,723,863 | 2/1988 | Takagi et al. . |
| 4,724,510 | 2/1988 | Wicker et al. . |
| 4,733,632 | 3/1988 | Ohmi et al. . |
| 4,735,866 | 4/1988 | Moorhead . |
| 4,751,609 | 6/1988 | Kasahara . |
| 4,771,730 | 9/1988 | Tezuka . |
| 4,835,344 | 5/1989 | Iyogi et al. . |
| 4,864,461 | 9/1989 | Kasahara . |
| 4,883,745 | 11/1989 | Mizuhara . |
| 4,912,838 | 4/1990 | Goto et al. . |
| 4,962,441 | 10/1990 | Collins ...................................... 361/234 |
| 5,055,964 | 10/1991 | Logan et al. . |
| 5,073,716 | 12/1991 | Clemens et al. . |
| 5,095,759 | 3/1992 | Mizuhara et al. . |
| 5,103,367 | 4/1992 | Horwitz et al. . |
| 5,117,121 | 5/1992 | Watanabe et al. . |
| 5,129,572 | 7/1992 | Keilberth . |
| 5,151,845 | 9/1992 | Watanabe et al. . |
| 5,155,652 | 10/1992 | Logan et al. . |
| 5,194,697 | 3/1993 | Hegner et al. . |
| 5,241,216 | 8/1993 | Webster . |
| 5,280,156 | 1/1994 | Niori et al. ......................... 361/234 X |
| 5,315,473 | 5/1994 | Collins et al. . |
| 5,334,344 | 8/1994 | Hegner et al. .......................... 420/422 |
| 5,368,220 | 11/1994 | Mizuhora et al. ................... 228/124.5 |
| 5,382,469 | 1/1995 | Kubota et al. . |
| 5,413,360 | 5/1995 | Atari et al. . |
| 5,426,558 | 6/1995 | Sherman ............................... 361/234 |

FOREIGN PATENT DOCUMENTS

| | | |
|---|---|---|
| 0339903 | 11/1989 | European Pat. Off. . |
| 0351701 | 1/1990 | European Pat. Off. . |
| 0360529 | 3/1990 | European Pat. Off. . |
| 0473930 | 3/1992 | European Pat. Off. . |
| 0486966A1 | 5/1992 | European Pat. Off. . |
| 0498752 | 8/1992 | European Pat. Off. . |
| 0498852A1 | 8/1992 | European Pat. Off. . |
| 2455360 | 11/1980 | France . |
| 2520930 | 8/1983 | France . |
| 2554288 | 3/1985 | France . |
| 1098727 | 8/1961 | Germany . |
| 2806761 | 9/1978 | Germany . |
| 3013352 | 11/1980 | Germany . |
| 2950039 | 7/1981 | Germany . |
| 3439371 | 5/1985 | Germany . |
| 3344679 | 1/1987 | Germany . |
| 53-125065 | 11/1978 | Japan . |
| 57-54341 | 3/1982 | Japan . |
| 57-73934 | 5/1982 | Japan . |
| 57-187947 | 11/1982 | Japan . |
| 58-24143 | 2/1983 | Japan . |
| 58-102537 | 3/1983 | Japan . |
| 58-48434 | 3/1983 | Japan . |
| 58-48421 | 3/1983 | Japan . |
| 28-123381 | 7/1983 | Japan . |
| 58-190037 | 11/1983 | Japan . |
| 60-5539 | 1/1985 | Japan . |
| 60-79725 | 5/1985 | Japan . |
| 60-110133 | 6/1985 | Japan . |
| 60-157232 | 8/1985 | Japan . |
| 60-150632 | 8/1985 | Japan . |
| 60-197335 | 10/1985 | Japan . |
| 60-235423 | 11/1985 | Japan . |
| 60-261377 | 12/1985 | Japan . |
| 61-270046 | 11/1986 | Japan . |
| 61-260949 | 11/1986 | Japan . |
| 62-18727 | 1/1987 | Japan . |
| 62-29140 | 2/1987 | Japan . |
| 62-54637 | 3/1987 | Japan . |
| 62-78846 | 4/1987 | Japan . |
| 62-72136 | 4/1987 | Japan . |
| 62-120932 | 6/1987 | Japan . |
| 62-120931 | 6/1987 | Japan . |
| 62-172737 | 7/1987 | Japan . |
| 63-25706 | 5/1988 | Japan . |
| 63-131536 | 6/1988 | Japan . |
| 63-194345 | 8/1988 | Japan . |
| 63-283037 | 11/1988 | Japan . |
| 63-308340 | 12/1988 | Japan . |
| 64-18236 | 1/1989 | Japan . |
| 1-98218 | 4/1989 | Japan . |
| 1-152727 | 6/1989 | Japan . |
| 1-161716 | 6/1989 | Japan . |
| 1-177368 | 7/1989 | Japan . |
| 1-185176 | 7/1989 | Japan . |
| 1-187939 | 7/1989 | Japan . |
| 1-227454 | 9/1989 | Japan . |
| 1-241839 | 9/1989 | Japan . |
| 1-251735 | 10/1989 | Japan . |
| 1-274938 | 11/1989 | Japan . |
| 1-296639 | 11/1989 | Japan . |
| 1-321136 | 12/1989 | Japan . |
| 1-315935 | 12/1989 | Japan . |
| 1-315158 | 12/1989 | Japan . |
| 1-313954 | 12/1989 | Japan . |
| 1-310554 | 12/1989 | Japan . |
| 1-298721 | 12/1989 | Japan . |
| 2-27748 | 1/1990 | Japan . |
| 2-144934 | 6/1990 | Japan . |
| 2-206147 | 8/1990 | Japan . |
| 2-196442 | 8/1990 | Japan . |
| 3-3250 | 1/1991 | Japan . |
| 3-3252 | 1/1991 | Japan . |
| 3-3249 | 1/1991 | Japan . |
| 3-102820 | 4/1991 | Japan . |
| 3-102814 | 4/1991 | Japan . |
| 3-108354 | 5/1991 | Japan . |
| 3-147843 | 6/1991 | Japan . |
| 3-147844 | 6/1991 | Japan . |
| 3-145151 | 6/1991 | Japan . |
| 3-152953 | 6/1991 | Japan . |
| 3-163849 | 7/1991 | Japan . |
| 3-194948 | 8/1991 | Japan . |
| 3-181117 | 8/1991 | Japan . |
| 3-217043 | 9/1991 | Japan . |
| 3-211725 | 9/1991 | Japan . |

| | | | | | | |
|---|---|---|---|---|---|---|
| 3-236255 | 10/1991 | Japan. | | 4-180553 | 6/1992 | Japan. |
| 3-227554 | 10/1991 | Japan. | | 4-186863 | 7/1992 | Japan. |
| 3-255626 | 11/1991 | Japan. | | 1156875 | 7/1969 | United Kingdom. |
| 3-255625 | 11/1991 | Japan. | | 1424875 | 2/1976 | United Kingdom. |
| 3-283445 | 12/1991 | Japan. | | 2050064 | 12/1980 | United Kingdom. |
| 4-3957 | 1/1992 | Japan. | | 2068122 | 8/1981 | United Kingdom. |
| 4-146639 | 5/1992 | Japan. | | 2106325 | 4/1983 | United Kingdom. |
| 4-147642 | 5/1992 | Japan. | | 2147459 | 5/1985 | United Kingdom. |
| 4-132239 | 5/1992 | Japan. | | 2149697 | 6/1985 | United Kingdom. |
| 4-147643 | 5/1992 | Japan. | | 2154365 | 9/1985 | United Kingdom. |
| 4-170371 | 6/1992 | Japan. | | WO88/09054 | 11/1988 | WIPO. |
| 4-180552 | 6/1992 | Japan. | | WO90/11610 | 10/1990 | WIPO. |

ELECTROSTATIC CHUCK

CROSS-REFERENCE TO RELATED APPLICATIONS

This application is a continuation-in-part of U.S. patent application Ser. No. 07/925,086 (now U.S. Pat. No. 5,368,220), filed Aug. 4, 1992, entitled "Sealed Conductive Active Alloy Feedthroughs," and of published International Application No. PCT/GB93/01551 (International Publication No. WO 94/03923), filed Jul. 22, 1993 designating the United States (which designation thereafter was abandoned), and having the same title, which applications are incorporated herein in their entireties by this reference.

FIELD OF THE INVENTION AND DESCRIPTION OF AN ACTIVE ELEMENT

This invention relates to electrostatic chucks and more particularly to chucks formed by bonding ceramic members with a layer of active braze alloy. As discussed in U.S. patent application Ser. No. 07/925,086:

It is generally recognized that metals will not bond chemically to ceramics because the metallic electronic structure is not compatible with the ionic-covalent electronic structure of ceramic materials. A different phase is thus necessary at the interface as a compatible transition between the metal and the ceramic.

With oxide ceramics, the compatible phase (i.e. chemical bond) is one of the oxides of the metal. The oxide maintains a continuous electronic structure across the interface, and a transition in bond type and bond energies between the metal and the ceramic.

A balance of bond energies and a continuous electronic structure across an interface is generally indicative of a chemical bond, whether the bonding is ionic, covalent, or metallic. These factors do, however, influence the bond microstructure. For example, when the two reacting materials or phases (ceramic/ceramic or metal/metal) have no changes in valence, then the reaction is the formation of a solid solution alloy or compound by interdiffusion. When the two reacting materials (ceramic/metal) have changes in valence, then a reduction-oxidation (redox) reaction occurs.

The driving force for a redox reaction is a favorable negative standard free energy $\Delta G°_R$. In order to realize a favorable $-\Delta G°_R$, it is necessary to employ materials (i.e. metals) having sufficiently high oxygen potentials to reduce the cation (i.e. ceramic) with a lower oxidation potential. Such metals are commonly referred to as active elements and include, but are not limited to, titanium, zirconium, chromium and vanadium. Adding elements such as these to a metallic brazing alloy allows the alloy to react with and wet a ceramic interface for both oxide and non-oxide ceramics.

BACKGROUND OF THE INVENTION

Fabrication of semiconductor devices is a multi-step process. During processing, chucks are employed to immobilize the semiconductor wafers, despite, for example, gas pressure present at their rear, or back, faces. Such immobilization may occur either by vacuum pumping, mechanically, or electrostatically, and commercially-available chucks suitable for this purpose typically employ these principles of operation. Vacuum pumping is useful only in restricted instances, as it is ineffective when very low process chamber pressures are required.

Primarily because they are relatively inexpensive, mechanical clamps have been used widely in the semiconductor industry. Mechanical clamps physically engage the peripheries of the wafers, increasing the risk of contact damage and shielding the clamped areas from treatment or processing. This engagement may also produce debris (i.e. particles) that negatively affect wafer process yields. Mechanical clamps additionally are incapable of securing central portions of the wafers, resulting in undesirable bowing of these unsupported regions.

Electrostatic chucks, by contrast, use Coulombic forces to secure the entire rear face of a semiconductor wafer. As employed, these chucks are of two general types: monopolar and bi- (or multi-) polar. Monopolar electrostatic chucks, effectively functioning as one plate of a parallel-plate capacitor, include a thin dielectric layer coating and a single electrode supported by a base. A wafer, acting as the other capacitive plate, may then be placed over the dielectric. As a voltage is applied between the wafer and electrode, the wafer is attracted to the electrode and flattened against the adjacent dielectric material.

Multipolar electrostatic chucks typically include two or more electrodes themselves held at different electrical potentials. As a result, no net charge transfer to the wafer need occur. Existing bipolar electrostatic chucks are relatively difficult and expensive to construct, however, and may compel adjustment or balancing of the voltages present at the electrodes during processing of the wafer.

U.S. Pat. No. 4,384,918 to Abe, incorporated herein in its entirety by this reference, provides equations for the attractive force generated using electrostatic chucks. For the monopolar chuck, the attractive force "F" may be calculated as follows:

$$F = \frac{1}{2} \epsilon \frac{V^2}{d^2} S \qquad (1)$$

where $\epsilon$=the dielectric constant of the dielectric

V=the applied voltage d=the thickness of the insulator (dielectric) material

S=the area of the electrode Similarly, the attractive force for a bipolar chuck is given by:

$$F = \frac{1}{8} \epsilon \frac{V^2}{d^2} S \qquad (2)$$

In both equations (1) and (2), the attractive force exerted on the semiconductor wafer is inversely proportional to the square of the dielectric thickness.

As a consequence of these mathematical relationships, numerous efforts to decrease the thickness of the dielectric layer have been made. U.S. Pat. No. 4,480,284 to Tojo, et al., also incorporated herein in its entirety by this reference, mentions several such efforts, including using an adhesive agent to bond a mica, polyester, or barium titanate dielectric layer to an electrode disc and making the dielectric layer by an anodic treatment of metallic material. As discussed in the Tojo, et al. patent, however, the dielectric layers formed using these processes typically lack uniform thicknesses and flat surfaces and, in some cases, may crack over time. This unreliability is magnified when coupled with the expense associated with these complicated processes, reducing the commercial value of the processing technology.

The Tojo, et al. patent itself purports to disclose a method of forming a more reliable dielectric layer for use with an electrostatic chuck. According to the patent, aluminum oxide (i.e. alumina), titanium dioxide, or barium titanate (or mixtures thereof) is flame-sprayed on an electrode plate to create the dielectric layer. Because the rough surface generated using the flame spray process lacks sufficient dielectric strength, the layer is impregnated with plastic material. To reduce warping and cracking, the dielectric layer and electrode have substantially the same coefficient of thermal expansion.

SUMMARY OF THE INVENTION

The present invention provides a relatively low cost, easily-assembled electrostatic chuck. The chuck's dielectric layer exhibits high reliability under various conditions, enhancing its commercial usefulness as a substitute for those employed in existing mono- and multipolar electrostatic chucks. The layer may also be thinned to a thickness impractical for separately fabricated dielectric layers yet acceptable to allow the generation of adequate attractive force. The present invention additionally permits greater design flexibility and formation of large-sized electrostatic chucks if desired.

The invention generally comprises forming an electrostatic chuck by directly bonding (typically) planar ceramic discs or men, hers with a layer of active braze alloy. This single-step assembly presents numerous advantages over existing approaches, including use of commonly-available and relatively inexpensive components for the dielectric layer and remainder of the chuck. Employing similarly inexpensive pattern screen technologies for bonding patterns enhances formation of flexible geometries as well, and use of an active alloy allows electrical feedthroughs to the chuck electrode to be created. The active alloy functions not only as the electrode, but also as the mechanism for bonding the dielectric layer to the base of the electrostatic chuck.

Because the active alloy and ceramic have different coefficients of thermal expansion, the present invention also improves the integrity of the dielectric layer by generating net compressive surface stresses in the ceramic. Depending on the active alloy selected, a sufficiently high-temperature bond may be created to allow the electrostatic chuck to be used at temperatures above those commonly utilized for chucks formed through, for example, organic adhesive methods. Appropriate patterns and thicknesses of active alloy may also enhance the uniformity of the radio frequency field in plasma-enhanced chemical vapor deposition equipment.

It is therefore an object of the present invention to provide an electrostatic chuck formed by bonding ceramic materials with a layer of active alloy.

It is another object of the present invention to provide an electrostatic chuck in which an active alloy acts as both a conductive layer and the means by which a dielectric layer is bonded to the base of the chuck.

It is also an object of the present invention to provide an electrostatic chuck in which flexible geometries may be formed by patterning the active alloy.

It is yet another object of the present invention to provide an electrostatic chuck in which the active alloy also accomplishes formation of electrical feedthroughs to the chuck electrode.

Other objects, features, and advantages of the present invention will be apparent with reference to the remainder of the written portion and the drawings of the application.

DETAILED DESCRIPTION

Figure 1:
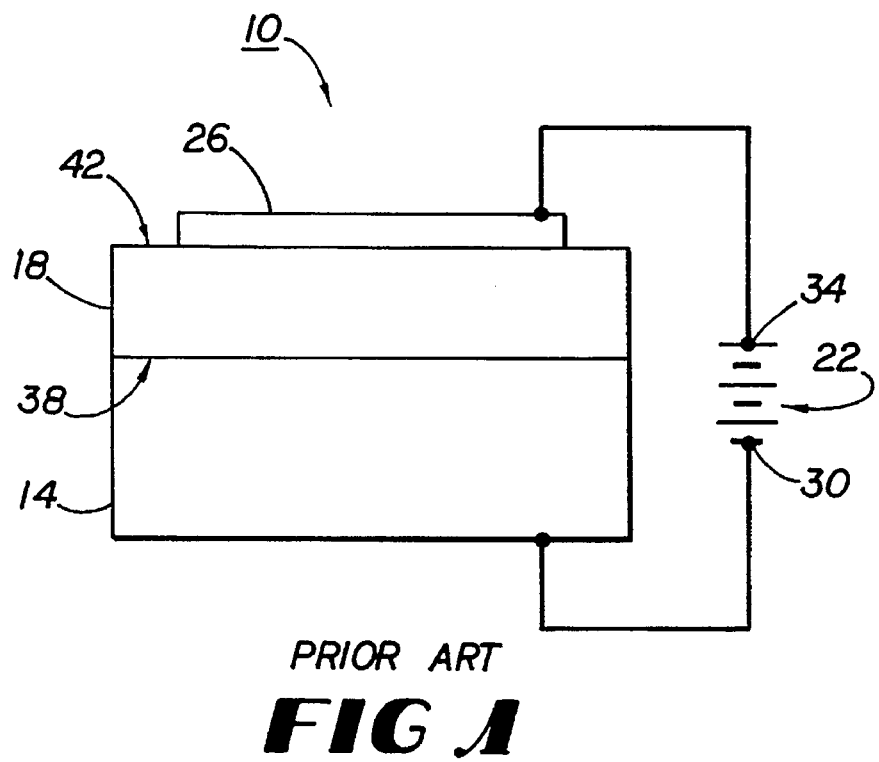
FIG. 1 is a cross-sectional, partially schematicized view of a typical electrostatic chuck shown in connection with a sample and power source.

FIG. 1 illustrates a common monopolar electrostatic chuck 10, including electrode plate 14 and dielectric layer 18. Also shown in FIG. 1 are power source 22 and a sample 26 such as (but not limited to) a semiconductor wafer. When chuck 10 is in use, negative terminal 30 of power source 22 is electrically connected to electrode plate 14 and positive terminal 34 is electrically connected to sample 26, thereby generating an electric field between the electrode plate 14 and the sample 26. Dielectric layer 18, in turn, is polarized, with its lower surface 38 becoming positively charged and its upper surface 42 becoming negatively charged. The resulting polarization electrostatically attracts sample 26 toward electrode plate 14, securing it against dielectric layer 18. The same effect, moreover, results when the polarity is reversed.

Figure 2A:
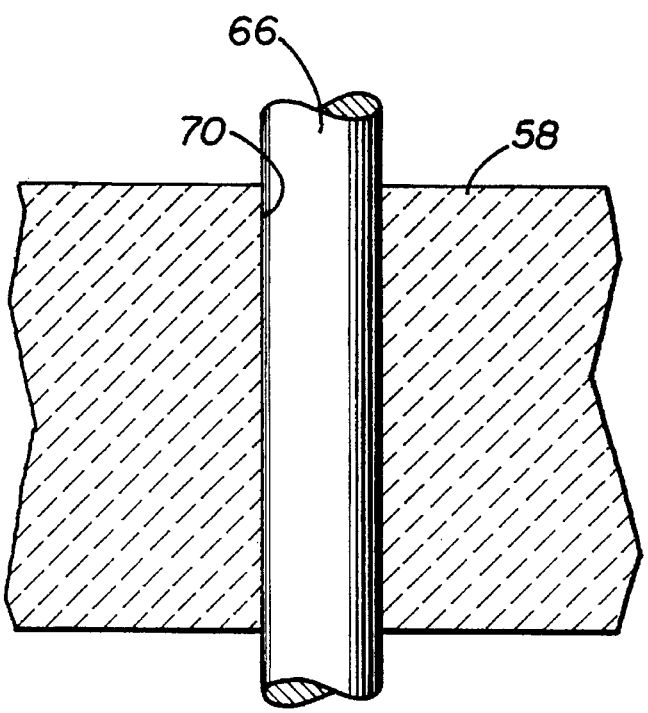
FIG. 2A, similar to FIG. 4 of U.S. patent application Ser. No. 07/925,086, is a cross-sectional view of an exemplary feedthrough which may form part of the electrostatic chucks of the present invention.
Figure 2:
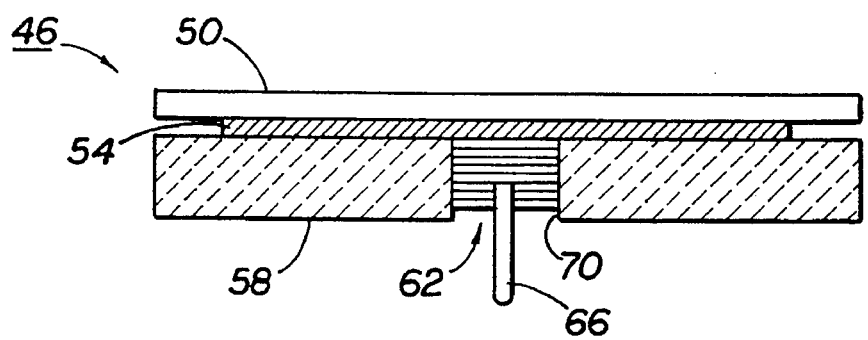
FIG. 2 is a cross-sectional view of a monopolar electrostatic chuck of the present invention.

Illustrated in FIG. 2 is an exemplary monopolar electrostatic chuck 46 of the present invention. Like chuck 10, chuck 46 comprises a dielectric layer 50 and an electrode 54. Chuck 46 also includes base 58, in which may be formed feedthrough 62. Unlike chuck 10, however, electrode 54 is an active braze alloy, while dielectric layer 50 and base 58 are typically ceramic materials such as (but not limited to) alumina, silicon nitride, aluminum nitride, barium titanate, or calcium titanate. For example, in some embodiments of the invention consistent with FIG. 2, dielectric layer 50 and base 58 are made essentially of (i.e. 94.0–99.8%) polycrystalline alumina, and electrode 54 is formed of an active alloy consisting essentially of one of the following (in weight percent):

(1) 0–97.5% Au, 0–15.5% Ni, 0–93.25% Ag, 0–35.25% Cu,

0–2.25% Ti, 0–12.5% In, 0–2% Al, 0–1% Sn, 0–3% Si,

0–0.75% Mo, 0–1.75% V (preferably 58–60% Ag, 26.25–28.25% Cu, 12–13% In, 1–1.5% Ti, provided as Incusil ABA™);

(2) 62–64% Ag, 33.25–35.25% CU, 0.75–1.25% Sn, 1.5–2.0% Ti (Cusin-1 ABA™);

(3) 62–64% Ag, 34.25–36.25% Cu, 1.5–2.0% Ti (Cusin ABA™);

(4) 92.25%–93.25% Ag, 4.5–5.5% Cu, 0.75–1.25% Al, 1–1.5% Ti (Silver ABA™);

(5) 92.25–93.25% Cu, 1.75–2.25% Al, 2.75–3.25% Si, 2–2.5 Ti (Copper ABA™);

(6) 95.9–96.9% Au, 2.5–3.5% Ni, 0.5–0.7% Ti (Gold ABA™);

(7) 81–83% Au, 14.5–16.5% Ni, 0.5–1.0% Mo, 1.5–2.0% V (Nioro ABA™);

(8) 64–66% Ag, 1.75–2.5% Ti, 31.5–34.25% CU (Cusil ABA™); or (9) nominally 70% Ti, 15% Cu, 15% Ni (Ticuni ABA™).

Although other active alloys may also be utilized in conjunction with the present invention, the listed alloys are commercially available from Wesgo, Inc., 477 Harbor Boulevard, Belmont, Calif. 94002. As with the other alloys suitable for use as electrode 54, they have a sufficiently active element to react chemically with the surface of ceramic (or other) materials chosen for dielectric layer 50 and base 58. Use of such active alloys is, moreover, a significant feature of the present invention, as the alloys function as both the conductive layer (electrode 54) of chuck 46 and the means by which dielectric layer 50 and base 58 bond.

One method of creating chuck 46 includes forming two ceramic discs and placing between them a sheet of an active alloy. The assembly is then brazed to bond the two ceramic discs using the active alloy. Conventional grinding techniques subsequently may be employed to reduce the thickness of one of the ceramic discs to between 0.004–0.010", a common thickness range for dielectric layer 50. Although, e.g., polycrystalline alumina will not normally retain its integrity at such reduced thicknesses, the active alloy uniformly holds each alumina grain in place to permit successful thinning to occur. Thus, the present invention avoids the need to use more expensive dielectric layer alternatives such as single crystal sapphire, allowing substitution of lower-cost ceramic materials instead (although sapphire may continue to be used if desired). Because the active alloy has a higher coefficient of thermal expansion than the alumina discs, brazing them also creates compressive stress in the alumina surfaces, which assist in maintaining the integrity of the layer during the grinding process.

In some embodiments, the two ceramic discs are 99.5% alumina initially one-eighth inch thick and of either one, three and one-half, or eight inch diameter, and the active alloy is a sheet of Copper ABA™ approximately 0.002" thick. Whichever of the two discs is thinned ultimately becomes dielectric layer 50, with the other denominated base 58. As noted above, the active alloy functions as electrode 54.

FIG. 2 also details feedthrough 62 which, if present, provides an electrically-conductive path through base 58 while excluding the passage of solid, liquids, and gasses. Discussed more fully in U.S. patent application Ser. No. 07/925,086, feedthrough 62 may itself comprise an active alloy wire or other contact 66 intended to react chemically with (ceramic) base 58. FIG. 2A, for example, taken from the co-pending application, depicts a feedthrough preform (contact 66) and article (base 58) heated for a predetermined time and temperature to achieve a brazing reaction at the interface between the inner surface of insertion hole (opening 70) of the article and the outer surface of the preform.

Figure 3:
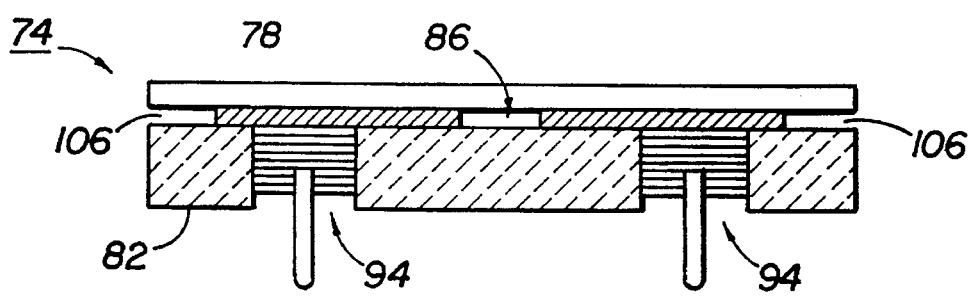
FIG. 3 is a cross-sectional view of a bipolar electrostatic chuck of the present invention.
Figure 4:
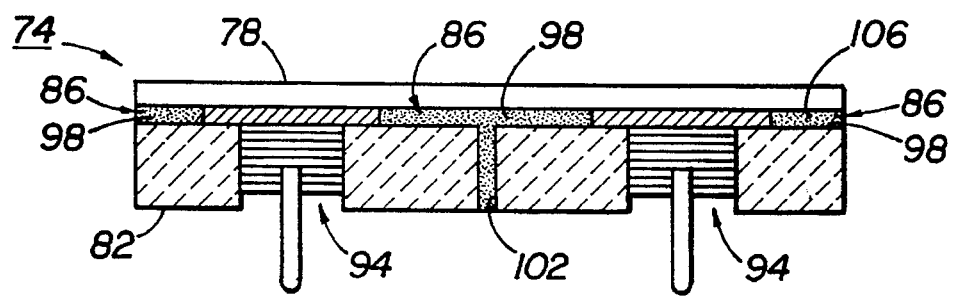
FIG. 4 is a cross-sectional view of a first alternate embodiment of the electrostatic chuck of FIG. 3.
Figure 5:
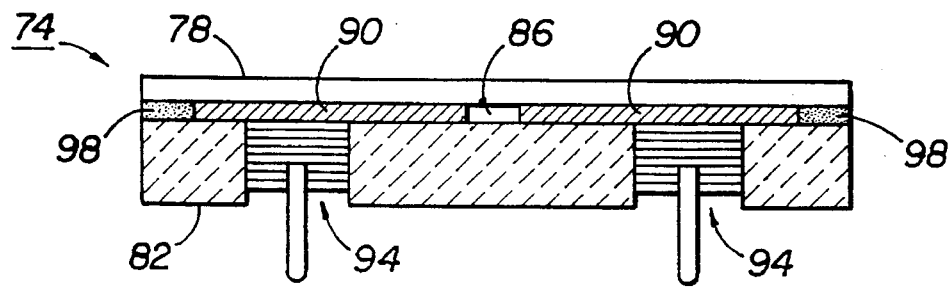
FIG. 5 is a cross-sectional view of a second alternate embodiment of the electrostatic chuck of FIG. 3.

FIGS. 3–5 illustrate exemplary bipolar electrostatic chucks 74 of the present invention. As with chuck 46, chucks 74 include dielectric layer 78 and base 82, each of which may be formed of a ceramic material. Unlike monopolar chuck 46, however, an active alloy is interposed between only portions of dielectric layer 78 and base 82, with other portions remaining unbonded. As shown in FIGS. 3–5, therefore, a non-conductive area 86 separates (dual) electrodes 90, each of which may be electrically connected to a feedthrough 94 through base 82. In FIGS. 3 and 5, area 86 is an air-filled space. Alternatively, area 86 may be filled with an organic or inorganic dielectric filler 98 such as epoxy or alumina-filled organometallic suspensions injected through port 102 in base 82 (FIG. 4). Peripheral areas 106 between dielectric layer 78 and base 82 may also contain filler 98 (FIGS. 4–5). Those skilled in the art will recognize that using pattern screen technologies for bonding patterns and an active alloy paste permits formation of other geometries, including those for multipolar electrostatic chucks. As described below, six pole chucks have been formed.

The following examples, although not intended to limit the scope or spirit of the appended claims, provide additional information concerning the present invention:

EXAMPLE 1

Two 3.5" diameter, 0.25" thick essentially polycrystalline alumina wafers were bonded with a layer of an active braze alloy paste composed substantially of, by weight, 92.25–93.25% Cu, 1.75–2.25% Al, 2.75–3.25% Si, and 2–2.5% Ti (Copper ABA™). The alloy layer was 0.003" thick, and the thickness of the upper ceramic layer was thereafter thinned to 0.004" by grinding. When evaluated as part of an electrostatic chuck under tests to 1 kV, the assembly performed well.

EXAMPLE 2

An 8" diameter, 0.375" thick essentially polycrystalline alumina disc was bonded to a similar disc using a 0,003" thick sheet (foil) of Copper ABA™. The top surface was thereafter thinned to 0.007" thick and the assembly evaluated as part of an electrostatic chuck. The chuck not only performed well at tests to 1.5 kV, but, because of the integrity of the dielectric layer, exhibited resistance greater than $10^{11}$ ohms at that voltage as well.

EXAMPLE 3

Two rectangular plates of 0.125" thick essentially polycrystalline alumina were bonded using a pattern-screened paste composed substantially of, by weight, 62–64% Ag, 34.25– 36.25 Cu, and 1.5–2.0 Ti (Cusin ABA™). After bonding, the dielectric layer was thinned successfully to a thickness ranging between 0.020" and 0.002". Unbrazed areas were supported with non-conductive polymerizable material, and feedthroughs were produced with active braze alloy wire melted into holes in the ceramic material. A rear face pigtail of copper also was used.

EXAMPLE 4

Two 5.2" diameter, 0.300" thick essentially polycrystalline alumina discs were bonded with Cusin-1 ABA™ paste applied in a star-shaped pattern that defined six separate electrode areas. Each electrode was attached to a nickel wire contact using active braze alloy. The active dielectric surface of the chuck was finished to a thickness of 0.009", and the thickness of the overall assembly was 0.125". Organic dielectric infiltrants were used in between electrode patterned areas. The chuck clamped a silicon wafer effectively at voltages from 500–1000 V without failure.

EXAMPLE 5

A 5.9" diameter, 0.089" thick ceramic electrostatic chuck was produced using screened Cusin ABA™ braze alloy to bond two ceramic members initially each 0.125" thick. The alloy produced a bipolar electrode having a concentric pattern. These electrodes were connected to the rear face of the chuck with active alloy feedthroughs that passed through the ceramic to nickel-copper alloy termination pins. Organic infiltrants sealed the edges. The dielectric surface of the chuck was 0.006" thick and grooved to allow passage of gasses in use.

EXAMPLE 6

A 2.5" diameter monopolar electrostatic chuck was produced with an active braze alloy paste feedthrough contact through the backside ceramic and a 0.006" thick top dielectric layer. An inorganic dielectric sealant was used in areas where the braze alloy electrode was not placed, permitting the chuck to operate to temperatures of 600° C. The initial thicknesses of the ceramic members from which the chuck was formed were 0.4" and 0.125", respectively, and the sealant comprised commercial inorganic liquids (silica and phosphate bonds) mixed with a very fine alumina powder to create a thermoset ceramic cement.

The foregoing is provided for purposes of illustration, explanation, and description of embodiments of the present invention. Modifications and adaptations to these embodiments will be apparent to those skilled in the art and may be made without departing from the scope and spirit of the invention.

What is claimed is:

1. An electrostatic chuck comprising:
   a. first and second members;
   b. an electrode comprising a metal interposed between and bonding portions of the first and second members by chemically reacting with them; and
   c. a non-conductive material, selected from the group consisting of inorganic dielectric filler and organic dielectric filler, interposed between portions of the first and second members not bonded by the metal.

2. An electrostatic chuck according to claim 1 further comprising means, extending through the second member, for electrically connecting the electrode to a power supply.

3. An electrostatic chuck according to claim 2 in which the electrically connecting means comprises an opening defined by the second member and an active alloy inserted into the opening.

4. An electrostatic chuck according to claim 1 in which the non-conductive material is a dielectric filler consisting of epoxy.

5. An apparatus for securing a semiconductor wafer for processing, comprising:
   a. first and second ceramic members, the first ceramic member defining a conductive feedthrough and a pork;
   b. an active braze alloy interposed between and bonding portions of the first and second ceramic members, the active braze alloy having a coefficient of thermal expansion greater than that of the first and second ceramic members;
   c. dielectric filler injected through the port and interposed between the portions of the first and second members not bonded by the active braze alloy; and
   d. means, electrically connected to the conductive feedthrough, for applying an electrical potential difference between the semiconductor wafer and active braze alloy and immobilizing the semiconductor wafer by electrostatic force.

6. An apparatus according to claim 5 in which at least one of the first and second ceramic members comprises material selected from the group consisting of silicon nitride, aluminum nitride, barium titanate, calcium titanate, and sapphire.

7. An electrostatic chuck comprising:
   a. first and second ceramic members, the first ceramic member defining a port;
   b. an electrode comprising a metal interposed between and bonding at least portions of the first and second ceramic members by chemically reacting with them; and
   c. dielectric filler injected through the port and interposed between the portions of the first and second ceramic members not bonded by the metal.

8. An electrostatic chuck according to claim 7 further comprising means, extending through the second member, for electrically connecting the electrode to a power supply.

9. An electrostatic chuck according to claim 8 in which the electrically connecting means comprises an opening defined by the second member and an active alloy inserted into the opening.

* * * * *

UNITED STATES PATENT AND TRADEMARK OFFICE
CERTIFICATE OF CORRECTION

PATENT NO. : 5,600,530
DATED : February 4, 1997
INVENTOR(S) : Peter C. Smith

It is certified that error appears in the above-indentified patent and that said Letters Patent is hereby corrected as shown below:

Column 3, line 21, delete "men, hers" and insert --members--

Column 8, line 2, delete "pork" and insert --port--

Signed and Sealed this

Seventeenth Day of March, 1998

Attest:

BRUCE LEHMAN

Attesting Officer

Commissioner of Patents and Trademarks